(12) United States Patent
Doguchi

(10) Patent No.: US 6,929,694 B2
(45) Date of Patent: Aug. 16, 2005

(54) CRYSTAL MANUFACTURE METHOD

(75) Inventor: Kentaro Doguchi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 107 days.

(21) Appl. No.: 10/368,866

(22) Filed: Feb. 19, 2003

(65) Prior Publication Data

US 2003/0154905 A1 Aug. 21, 2003

(30) Foreign Application Priority Data

Feb. 19, 2002 (JP) ......................................... 2002-041529

(51) Int. Cl.[7] .......................... C30B 21/02; C30B 28/06
(52) U.S. Cl. .............................. 117/82; 117/68; 117/78; 117/81; 117/940
(58) Field of Search .............................. 117/68, 78, 81, 117/82, 940

(56) References Cited

U.S. PATENT DOCUMENTS

| 6,488,769 B1 | * | 12/2002 | Oba | 117/68 |
| 2004/0123795 A1 | | 7/2004 | Toshio | 117/81 |

FOREIGN PATENT DOCUMENTS

| JP | 9-315893 | 12/1997 |
| JP | 10-330192 | 12/1998 |

* cited by examiner

Primary Examiner—Felisa Hiteshew
(74) Attorney, Agent, or Firm—Morgan & Finnegan, LLP

(57) ABSTRACT

A method for manufacturing fluoride crystal includes the steps of adding scavenger and a material to a crucible, melting the scavenger and material at a temperature higher than a melting point so that a ratio of a thickness of the fluoride crystal that has been melted to an inner diameter of the crucible may be 0.2 or higher, and gradually crystallizing and purifying the material.

8 Claims, 5 Drawing Sheets

CRYSTAL MANUFACTURE METHOD

BACKGROUND OF THE INVENTION

The present invention relates generally to crystal manufacture methods and apparatuses, and more particularly to a manufacture method for calcium fluoride ($CaF_2$) crystal usable as a material for optical elements used for an exposure apparatus for photolithography.

Along with the recent demands on smaller and thinner-profile electronic devices, finer semiconductor devices to be mounted onto these electronic devices have been increasingly demanded. For example, a design rule for a mask pattern tries to achieve a line and space (L & S) of 130 nm on a mass production line, and predictably it will be increasingly smaller in the future. L & S denotes an image projected to a wafer in exposure with equal line and space widths, and serves as an index of exposure resolution.

The exposure has three important parameters, i.e., resolution, overlay accuracy and throughput. The resolution is a minimum size for a precise pattern transfer. The overlay accuracy is a precision with which to overlay multiple patterns over an object to be exposed. The throughput is the number of sheets exposed per unit of time.

A shortened wavelength of exposure light and a larger aperture of a projection lens are effective for improved resolution. For the shortened wavelength, a light source has been in transition from KrF excimer laser (with a wavelength of approximately 248 nm) to ArF excimer laser (with a wavelength of approximately 193 nm), and $F_2$ excimer laser (with a wavelength of approximately 157 nm) is about to reduce to practice. On the other hand, a lens with a diameter of 250 mm or larger has been developed for the larger aperture.

The $CaF_2$ crystal has higher light transmittance (or internal transmittance) for this wavelength range than other glass materials, and thus is the best as an optical material for optical elements, such as a lens and a diffraction grating, applicable to an exposure optical system.

Parameters for evaluating optical materials for a lens, etc. include, in addition to the internal transmittance, laser durability indicative of transmittance changes in response to continuous receptions of a laser beam, refractive index homogeneity indicative of a degree of constant of a lens's refractive index according to positions, birefringence, process or (grinding) accuracy, etc.

A method for manufacturing $CaF_2$ crystal with good one or more optical characteristics among them has been already disclosed in Japanese Laid-Open Patent Applications Nos. 9-315893 and 10-330192.

However, the $CaF_2$ crystal manufactured by the conventional manufacture methods exhibit satisfactory optical characteristics for visible light, but has a disadvantage in that it has not yet exhibited satisfactory optical characteristics for short-wavelength and high-power light such as excimer laser, e.g., low laser durability, large refractive index homogeneity and birefringence, poor surface precision at the time of grinding process, etc.

As a result that the instant inventor has eagerly studied the causes, he has found that it results from the crystal or lattice defect or dross inclusion. The dross inclusion is generally removed through segregation from one-way cooling and crystallization in the purification process.

However, the crystal for use with the excimer laser has such a large aperture that it has a difficulty in one-way crystallization and cannot sufficiently remove impurities disadvantageously.

This is because as the crystal aperture becomes large, a ratio of thickness to aperture diameter becomes small, causing the uniform melt temperature distribution during melting, or the small temperature difference between top and bottom surfaces in the melt, as shown in FIG. 4. Although FIG. 4 shows a temperature distribution with a ratio of thickness to aperture diameter of 0.15, the dimension in FIG. 4 does not accord with the description for simplicity purposes.

The temperature at the bottom surface of a skull crucible containing the melt is adapted to be lower than that at the top surface. The purification process is implemented at considerably higher temperature than the melting point due to dehydration and degas, and does not use a seed that is usually used for monocrystal growth.

Therefore, impurities of relatively light specific gravity gathering at the top surface in the melt becomes a starting point for crystallization or nucleus, resulting in crystallization from the top surface as well as from the bottom surface in the melt at a low temperature. As a result, impurities, such as rare earth, and bubbles concentrate in the middle of crystal, which is a part finally solidified, and are hard to be removed.

Table 1 shows impurity data in $CaF_2$ crystal, which is magnesium as an example. It is understood that the middle has higher magnesium concentration than the top and the bottom. In other words, magnesium accumulates in the center.

TABLE 1

|  | Mg CONTENT |
|---|---|
| TOP PART | 0.55 |
| MIDDLE PART | 1.00 |
| BOTTOM PART | 0.68 |

BRIEF SUMMARY OF THE INVENTION

Accordingly, it is an exemplary object of the present invention to provide a novel and useful calcium fluoride crystal, its manufacture method, an optical element using the calcium fluoride crystal, an exposure apparatus using the optical element for its optical system, a device fabrication method using the exposure apparatus, and a device manufactured by use of the exposure apparatus.

Another specific and exemplary object of the present invention is to provide calcium fluoride crystal having excellent optical characteristics including the laser durability, and its manufacturing method.

Another exemplary object of the present invention is to provide an optical element using the calcium fluoride crystal, and an exposure apparatus using this optical element for its optical system, especially for lithography using excimer laser as an exposure light source).

Still another exemplary object of the present invention is to provide a device manufacture method using the exposure apparatus and high quality devices (such as semiconductors, LCDs, CCDs, thin magnetic heads) fabricated using the exposure apparatus.

A method for manufacturing fluoride crystal includes the steps of adding scavenger and a material to a crucible, melting the scavenger and material at a temperature higher than a melting point so that a ratio of a thickness of the fluoride crystal that has been melted to an inner diameter of the crucible may be 0.2 or higher, and gradually crystallizing and purifying the material. The inner diameter of the crucible may be 250 mm or larger. The crucible is divided into a plurality of parts like a multistage structure. The method may include the steps of melting the purified fluoride crystal, and growing the fluoride crystal to obtain fluoride monocrystal. The fluoride crystal is, for example, calcium fluoride.

An optical element made of fluoride crystal manufactured by the above method, an exposure apparatus including an optical system that uses the above optical element, and a device fabrication method including the steps of exposing an object using the above exposure apparatus, and performing a predetermined process for the exposed object constitute other aspects of the present invention.

The above optical element may include, for example, a lens, a diffraction grating, an optical film, or a combination thereof. For example, it may include a lens, a multi-lens, a lens array, a lenticule lens, a fly-eye lens, an aspheric lens, a diffraction grating, a binary optics element or a combination thereof. The optical element includes, for example, an optical sensor in addition to a single lens (e.g., for use with focus control). The exposure light may use ultraviolet light, far ultraviolet light, and vacuum ultraviolet light as exposure light.

Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

A method for manufacturing fluoride crystal as one embodiment includes the steps of purifying a calcium fluoride ($CaF_2$) material by filling and melting the material so that a ratio of a thickness of melted fluoride crystal to an inner diameter of a crucible may be 0.2 or higher. Following the purification, there is provided a step of removing a hazardous material for high purification, such a step for removing impurities that has partially concentrated through segregation, such as rare earth using a grinder and a blaster. An optical element of one embodiment is made of this $CaF_2$ crystal. Such calcium fluoride crystal includes little impurities and gas, and thus would provide an optical element having excellent optical characteristics including refractive index homogeneity, birefringence, internal transmittance, and laser durability.

A purification process adjusts a ratio of a thickness of melted crystal and an inner diameter of a crucible to be 0.2 or larger to avoid solidification of a material from both the top and bottom. For example, the inner diameter in the crucible is dimensioned to be 250 mm or larger. The amount of the material and the depth in the crucible are designed based on the bulk specific gravity of the material so that when the powder material is supplied and melted, a distance from the bottom of the crucible to the top surface of the melt is at least 0.2 times as large as the inner diameter in the crucible.

Figure 3:
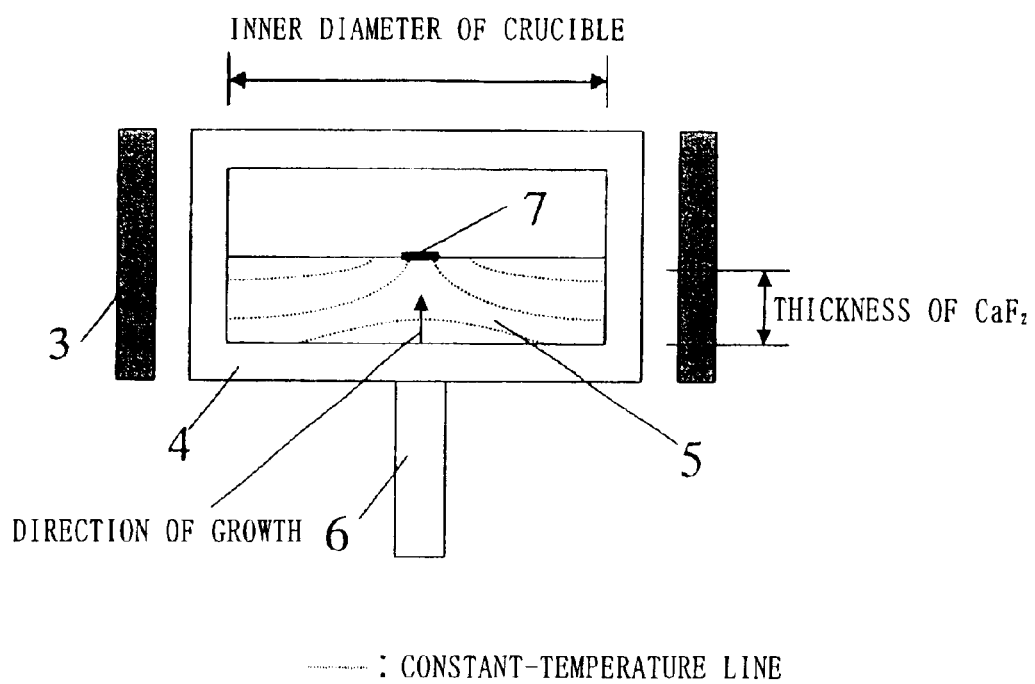
FIG. 3 is a temperature distribution in a crucible according to an inventive manufacture method.
Figure 4:
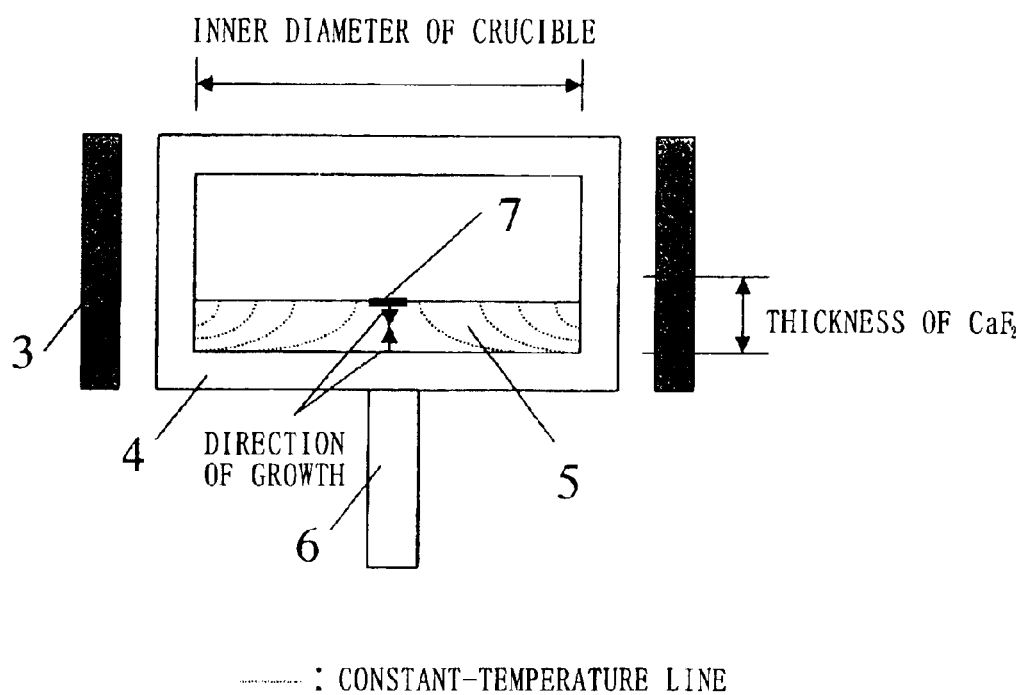
FIG. 4 is a temperature distribution in a crucible according to a conventional manufacture method.

FIG. 3 shows a temperature distribution in the crucible when the material is melted in this way. Due to the large temperature difference between the top and bottom surfaces, the solidification occurs in one direction, i.e., from only a surface at a lower temperature. As a result, the top surface of the purified crystal is solidified finally and air bubbles and impurities of small specific gravity accumulate on the top surface while impurities, such as rare earth, accumulate on the top and bottom surfaces in the crystal due to segregation, they are extremely removed in the post-treatment.

A concrete description will now be given of $CaF_2$ crystal using a crucible descent process of the preferred embodiment according to the present invention, although the present invention is not limited to the crucible descent process.

Scavenger is added to and fully mixed with the fluoride material. The solid scavenger is added by 0.02 mol % to 2 mol %. The fluoride used as scavenger preferably includes zinc fluoride, cadmium fluoride, manganese difluoride, bismuth fluoride, sodium fluoride, lithium fluoride, and those which are more easily combinable with oxygen than the fluoride to be grown, and easily decompose and evaporate.

Figure 1:
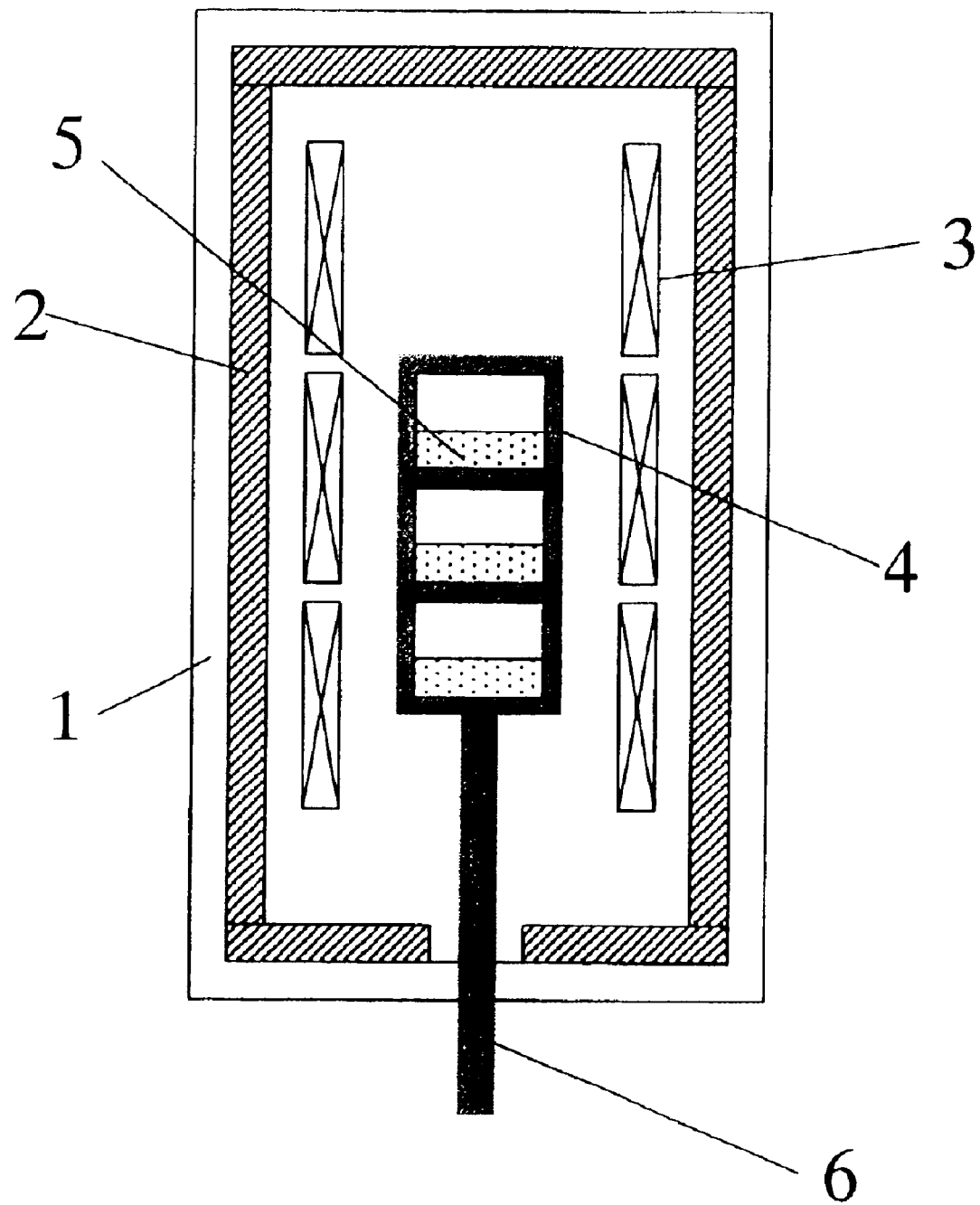
FIG. 1 is a schematic sectional view of a purification furnace used for purification.

The fluoride material added and mixed with scavenger is put in the crucible of a purification furnace shown in FIG. 1. In FIG. 1, 1 is a chamber of the purification furnace, which is connected to a vacuum pumping system. 2 is a heat insulation member, 3 is a heater, which forms, in a space that accommodates the crucible inside the heater, a temperature distribution with a temperature range including a melting point of the crystalline material, when the crystalline material that has once melted gradually solidifies. 4 is a multistage crucible having an inner diameter of 250 mm or larger and a depth of at least 0.6 times as large as the inner diameter. 5 is calcium fluoride ($CaF_2$). 6 is a bar that supports the crucible, and is connected to a mechanism for moving the bar up and down.

The furnace is vacuum-exhausted, and then the heater is electrified to heat the crucible. The furnace is initially heated at about 150° C. to 200° C., whereby water and inert gas are eliminated. The furnace is then heated so as to form the predetermined distribution of temperature as mentioned above. The crucible is placed at a high temperature region of the distribution, and then the $CaF_2$ material is heated via a temperature range 350° C.–1100° C. in which the scavenger is melted and the scavenge reaction begins. This heating is set enough slow for the scavenge reaction.

After the material is melted, the melt condition is left for several hours to tens of hours so as to eliminate residual impurities. Then, the crucible is descended in the temperature distribution formed in the furnace and the melted $CaF_2$ material is gradually cooled for crystal growth. The height of the melted material is set at least 0.2 times as large as the inner diameter of the crucible. A top of the crucible is thus maintained at a sufficiently higher temperature than the melting point of $CaF_2$ in comparison with a bottom of the crucible, and a start of solidification is prevented at this part. This process does not require such precise temperature control as in the following process of single crystal growth, and the obtained crystal may be multicrystal or include grain boundary.

Among thus obtained crystal, the top and bottom parts, i.e., first and last crystallized parts are eliminated. Impurities concentrate or segregate on these parts, and thus these parts are eliminated to eliminate impurities that negatively affect characteristics of the crystal.

Single crystal is grown from the purified crystal as a material. A growth process is pursuant to the Bridgman method as an example.

Figure 5:
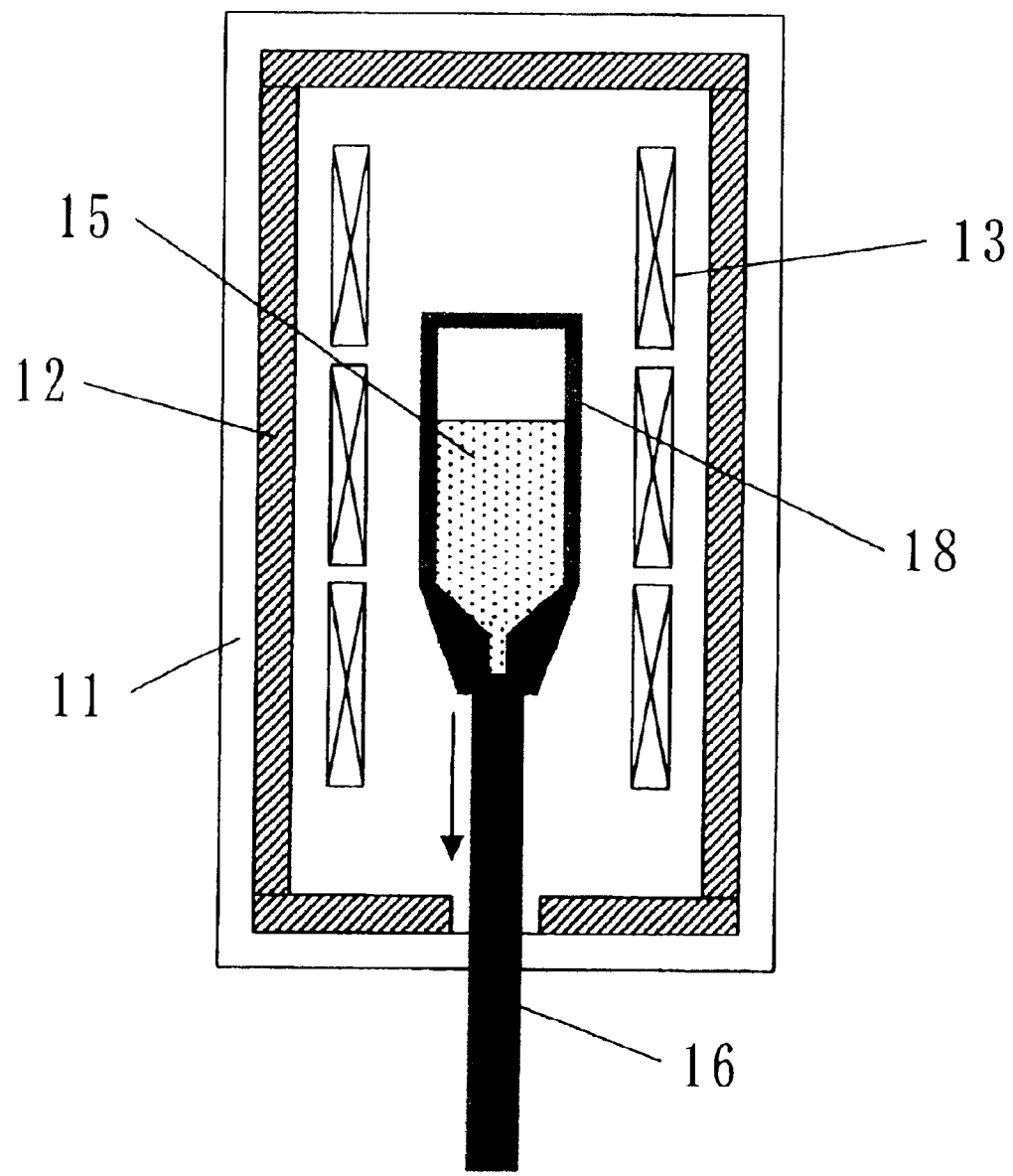
FIG. 5 is a schematic sectional view of a growth furnace used for crystal growth.

The purified crystal is put in the crucible in the growth furnace shown in FIG. 5. In FIG. 5, 11 is a chamber for the growth furnace, which is connected to a vacuum pumping system. 12 is a heat insulation member. 13 is a heater. 18 is a crucible having an inner diameter of 250 mm or larger. 15 is fluoride produced in the purification process. 16 is a bar that supports the crucible, and is connected to a mechanism for moving the bar up and down.

The fluoride crystal is set in the crucible for growth, for example, by longitudinally piling the appropriate number of crystal discs. As the crucible shape for growth should be selected according to a size of a finished product, it is preferable to use a purification crucible with a corresponding shape and efficient size.

After the furnace is vacuum-exhausted, the heater 3 is electrified to heat the crucible and the material is completely melted. Then, the crucible is descended slowly and cooled so as to grow the single crystal. The descending speed of the crucible depends upon the furnace structure, but is preferably 1 mm to 5 mm per hour. The grown fluoride crystal is then subject to the heat treatment in an anneal furnace, and then molding into a shape of a necessary optical element.

A lens thus obtained would be applicable to projection and illumination optical systems suitable for excimer laser, e.g., in particular, ArF excimer layer and $F_2$ excimer laser. In addition, an exposure apparatus for photolithography may include such an optical system having a lens made of $CaF_2$ crystal obtained by the inventive manufacture method, and a stage for moving a substrate.

FIRST EXAMPLE

Zinc fluoride was added as scavenger and mixed with the calcium fluoride material by about 0.076 mol %. Then, this mixture was put in the multistage crucible having a bore of 250 mm and a depth of 150 mm in a purification furnace shown in FIG. 1 and the furnace was exhausted. Then, the crucible was heated up to 1420° C. and the material was melted. The crucible was then descended at a speed of 20 mm/h and cooled gradually, and the material was crystallized. The crystallized block size was a diameter of 250 mm and a thickness of 50 mm. Air bubbles, etc. concentrated at the top of the crystal, and thus good crystal was obtained.

Next, the above crystal block was put in the crucible for single crystal growth shown in FIG. 5. The furnace was vacuum-exhausted, and the temperature was maintained to be 1420° C. for 30 hours. Then, the crucible for growth was descended at a speed of 1 mm/h.

Then, the grown calcium fluoride single crystal and zinc fluoride of 0.1 weight % were put in a crucible in the anneal furnace. After the furnace was vacuum-exhausted, the temperature in the crucible was heated from the room temperature to 900° C. at a speed of 100° C./h and maintained at 900° C. for 20 hours. Then, it was cooled at a speed of 6° C./h down to the room temperature. Calcium fluoride thus obtained had excellent transmittance and remarkably little deterioration.

SECOND EXAMPLE

Figure 2:
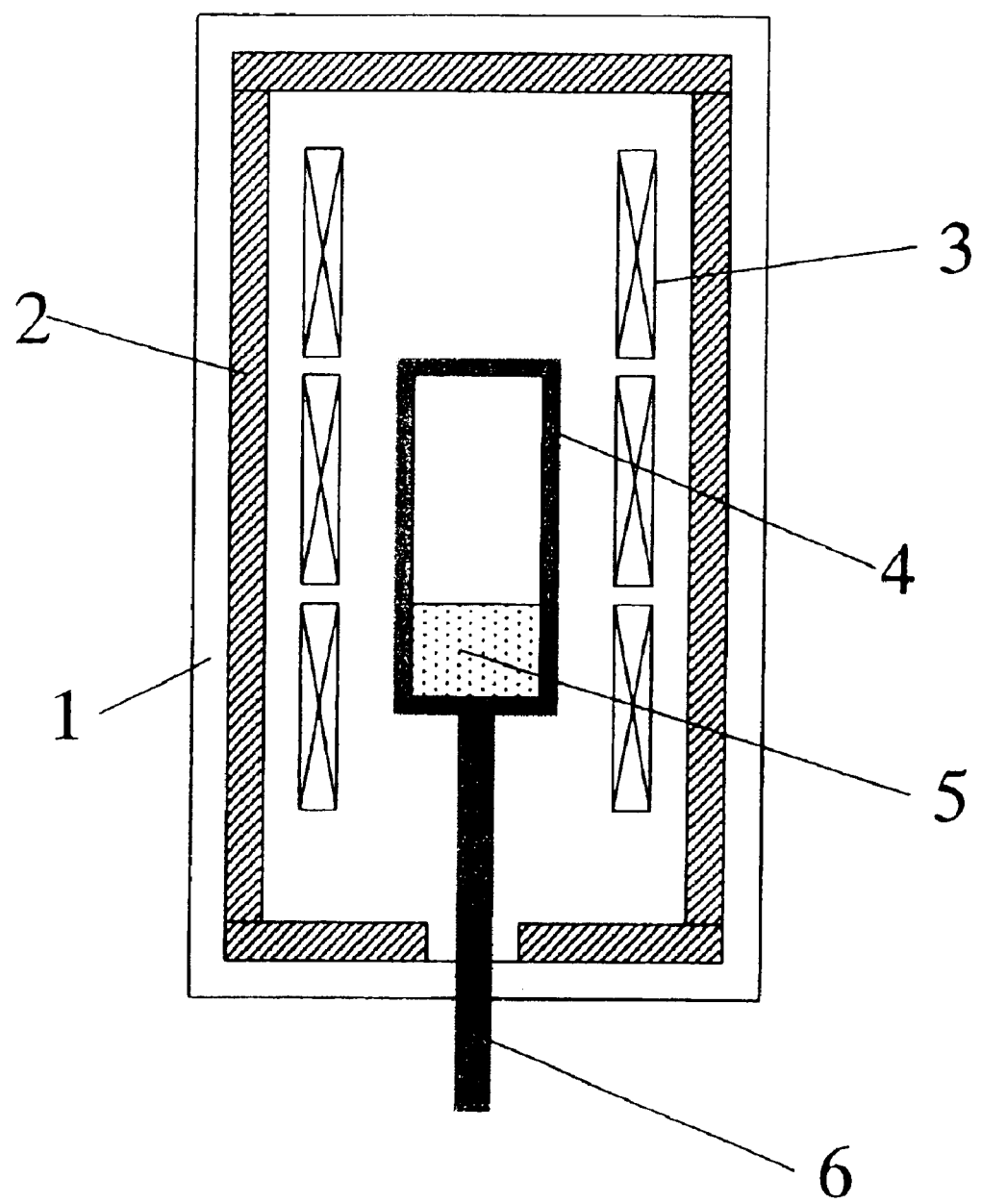
FIG. 2 is a schematic sectional view of a purification furnace used for purification.

This example is the same as the first example except for including the steps of cutting, after the material was purified using one stage of crucible having a depth shown in FIG. 2, the top and bottom surfaces accumulating impurities, and processing so that it may have a size that facilitates installation into the growth furnace. Calcium fluoride thus obtained had excellent transmittance and remarkably little deterioration.

The present invention may provide calcium fluoride crystal having excellent optical characteristics, and its manufacture method and apparatus. An optical element made of such calcium fluoride crystal is applicable to an optical system in an exposure apparatus for fabricating high-quality devices through exposure with high resolution and throughput.

What is claimed is:

1. A method for manufacturing a fluoride crystal, the method comprising the steps of:
    adding a scavenger and a material to a crucible;
    melting the scavenger and material at a temperature higher than a melting point of the material so that a ratio of a thickness of the material that has been melted to an inner diameter of the crucible is 0.2 or higher; and
    gradually crystallizing and purifying the material into a purified fluoride crystal.

2. A method according to claim 1, wherein the inner diameter of the crucible is 250 mm or larger.

3. A method according to claim 1, wherein the crucible is divided into a plurality of parts like a multistage structure.

4. A method according to claim 1, further comprising the steps of:
    melting the purified fluoride crystal; and
    growing the melted, purified fluoride crystal to obtain a fluoride single crystal.

5. A method according to claim 1, wherein the fluoride crystal is calcium fluoride.

6. An exposure apparatus comprising an optical system including an optical element made of fluoride crystal, said fluoride crystal being manufactured by a method including the steps of
    adding a scavenger and a material to a crucible,
    melting the scavenger and the material at a temperature higher than a melting point so that a ratio of a thickness of the fluoride crystal that has been melted to an inner diameter of the crucible may be 0.2 or higher, and
    gradually crystallizing and purifying the material into a purified fluoride crystal.

7. A device fabrication method comprising the steps of: exposing an object using an exposure apparatus, wherein said exposure apparatus comprises an optical system including an optical element made of a fluoride crystal, said fluoride crystal being manufactured by a method including the steps of
    adding a scavenger and a material to a crucible,
    melting the scavenger and the material at a temperature higher than a melting point so that a ratio of a thickness of the material that has been melted to an inner diameter of the crucible may be 0.2 or higher, and
    gradually crystallizing and purifying the material into a purified fluoride crystal.

8. A device fabrication method according to claim 7, wherein said exposing step uses a light selected from the group consisting of: ultraviolet light, far ultraviolet light, and vacuum ultraviolet light.

* * * * *